United States Patent [19]
Reber et al.

[11] Patent Number: 5,491,871
[45] Date of Patent: Feb. 20, 1996

[54] SOLDER PASTE AND CONDUCTIVE INK PRINTING STENCIL CLEANER

[75] Inventors: Douglas M. Reber, Kokomo; Jennifer E. Clark, Noblesville; Timothy D. Garner, Kokomo, all of Ind.

[73] Assignee: Delco Electronics Corp.

[21] Appl. No.: 163,018

[22] Filed: Dec. 8, 1993

[51] Int. Cl.$^6$ ............................................. A47L 5/38
[52] U.S. Cl. .................................................... 15/308
[58] Field of Search .............................. 15/306.1, 308, 15/309.1, 312.1, 102; 101/425

[56] References Cited

U.S. PATENT DOCUMENTS

| | | | |
|---|---|---|---|
| 3,737,940 | 6/1973 | Moestue et al. | 15/302 |
| 4,145,790 | 3/1979 | Wessells et al. | 15/312.1 X |
| 4,543,684 | 10/1985 | Bandoh et al. | 15/312.1 X |
| 5,197,159 | 3/1993 | Truong | 15/312.1 X |
| 5,206,970 | 5/1993 | Johnson | 101/425 X |
| 5,309,837 | 5/1994 | Nanzai | 101/425 |

Primary Examiner—Chris K. Moore
Attorney, Agent, or Firm—Cary W. Brooks; Mark A. Navarre

[57] ABSTRACT

A solder paste or conductive ink printer stencil wiper apparatus combining a dual action of sucking stencil holes and simultaneously wiping the bottom of the stencil for excess solder. The apparatus includes a vacuum nozzle constructed and arranged to draw excess solder gathered in the holes of the stencil through the nozzle to a collection reservoir. The apparatus also includes a wiping element for wiping the bottom of the stencil at the same time the vacuum is sucking solder out of the stencil holes. The wiper includes a wiper fabric to wipe the bottom of the stencil. The fabric is provided on a roll, and the fabric is pulled through a series of rollers by a motor and collected on a take-up roller.

4 Claims, 2 Drawing Sheets

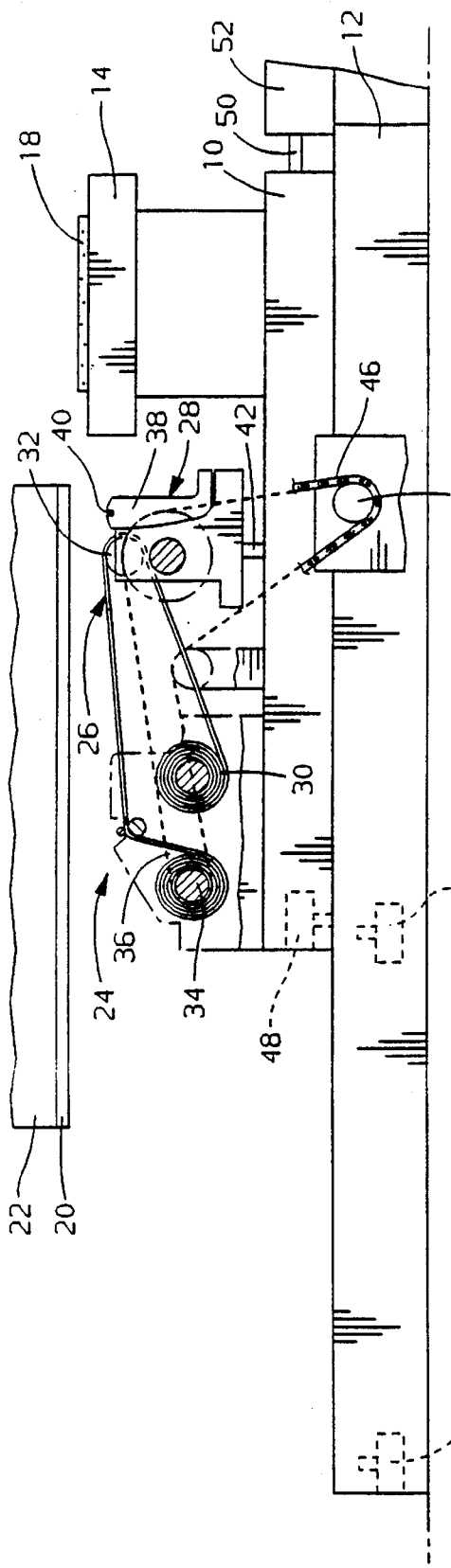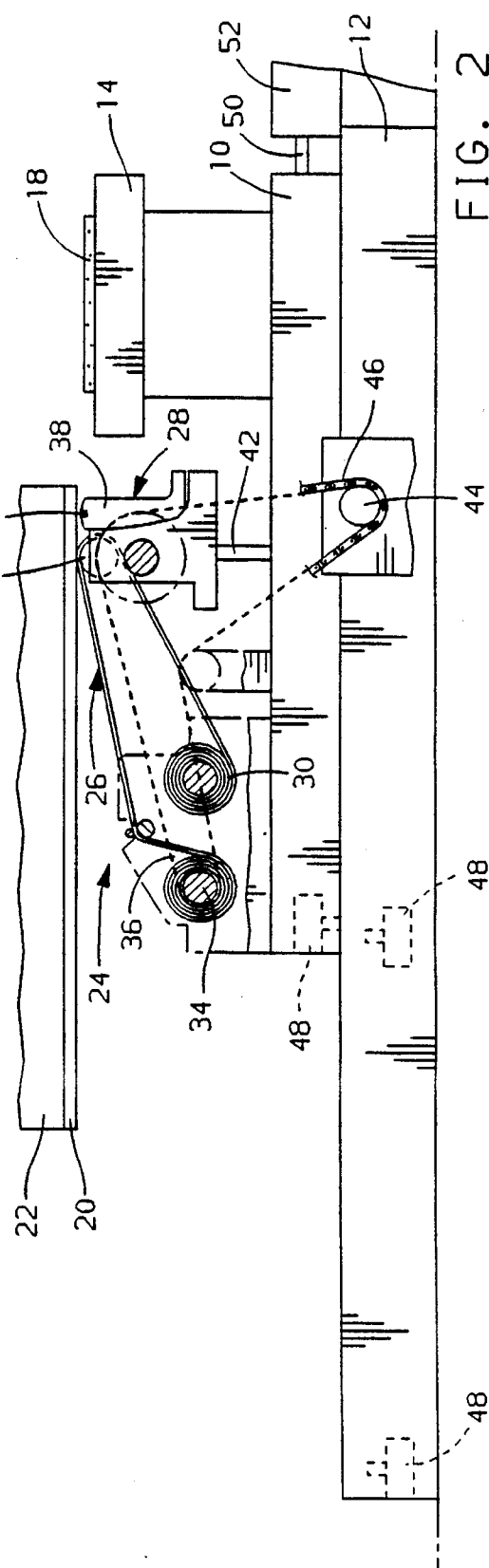

SOLDER PASTE AND CONDUCTIVE INK PRINTING STENCIL CLEANER

FIELD OF THE INVENTION

This invention relates to a solder paste and conductive printer stencil cleaning apparatus, and more particularly to such an apparatus capable of dual action of vacuuming a printing composition from stencil holes and simultaneously wiping the bottom of the stencil to remove excess printing composition such as solder paste or conductive ink.

BACKGROUND OF THE INVENTION

In the manufacture of a hybrid semiconductor devices, conductive ink or solder paste is selectively printed on a substrate such as a ceramic substrate or a fiberglass circuit board. A metal or plastic stencil is often used for this printing operation and particularly where solder bumps are printed on the substrate. In prior operations of this type, the circuit board to receive solder bumps is placed on a vacuum printing nest. The nest is attached to a slide which, following alignment, is shuttled under a metal stencil which is preferably made of brass or stainless steel. Once under the stencil, solder paste is deposited on the stencil and is squeezed through the holes in the stencil by a squeegee which is moved across the upper face of the stencil. When the printing is complete, the circuit board, nest and slide, being connected together, are shuttled back to an operator where the circuit board is removed and the process is repeated. However, excessive solder often gathers in the holes of the stencil and impedes the flow of solder to the circuit board. Further, solder paste or conductive ink may wick along the bottom face of the stencil adjacent the hole formed therein. This results in smudged conductive lines or solder paste upon subsequent printing and may even result in unintentional shorting between circuit lines. Further, the solder bumps printed in this manner are notably deformed and hence are not of uniform quality from board to board. This may cause further problems when a semiconductor device, such as an integrated flip-chip, is connected and secured to the solder bumps.

Operators have been known to manually wipe the bottom of the solder paste stencil to remove excess solder paste. However, this is not sufficient to dislodge solder gathered in the holes of the stencil. Further, manual removal of excessive solder paste is labor and time intensive, and not always reliable.

Heretofore, there has been a need for an automated, reliable method of cleaning solder paste and conductive ink stencils and removing solder paste or ink gathered in the holes of the stencil.

SUMMARY OF THE INVENTION

The invention includes a solder paste or conductive ink printer stencil cleaning apparatus combining a dual action of vacuuming stencil holes and simultaneously wiping the bottom of the stencil for excess solder or ink. The apparatus includes a vacuum nozzle constructed and arranged to draw excess solder or ink, gathered in the holes of the stencil, through the nozzle to a collection reservoir. The apparatus also includes a wiping element for wiping the bottom of the stencil at the same time the vacuum is sucking solder or ink out of the stencil holes. The wiper includes a wiper fabric to wipe the bottom of the stencil. The fabric is provided on a supply roller, and the fabric is pulled through a series of rollers by a motor and collected on a take-up roller.

In operation, a circuit board is placed on a print nest carried by a slide. The circuit board, nest and slide are shuttled towards the stencil. As the slide triggers the first of two proximity switches, the vacuum nozzle and the wiper of the apparatus are raised, by a compact air cylinder connected to suck assemblies, to contact the stencil. When the vacuum nozzle and wiper contact the stencil, the apparatus is further advanced along the slide so that the vacuum nozzle sucks the holes of the stencil and the fabric is advanced by the motor and wipes the bottom of the stencil. As the fabric is advanced by the motor, a clean fabric surface is continually provided for wiping the bottom of the stencil during the cleaning operation. When the apparatus triggers a second proximity switch, the vacuuming and wiping operations are stopped and the vacuum nozzle and wiper are lowered by the compact air cylinder. Now the stencil has been cleaned, and the cycle of printing on a new circuit board and cleaning the stencil is repeated. Thus, the apparatus according to the present invention assures uniformity of solder bumps or ink printed through the cleaned stencil.

These and other features, objects and advantages of the present invention will become apparent from the following brief description of the drawings, detailed description and appended claims and the drawings.

BRIEF DESCRIPTION OF THE DRAWINGS

FIG. 1 illustrates a stencil cleaning apparatus according to the present invention including a dual action wiper and vacuum sub-assembly in a position away from a stencil;

FIG. 2 illustrates a stencil cleaning apparatus according to the present invention including a dual action wiper and vacuum sub-assembly in a position engaging a stencil at one end.

DETAILED DESCRIPTION

Figure 3:
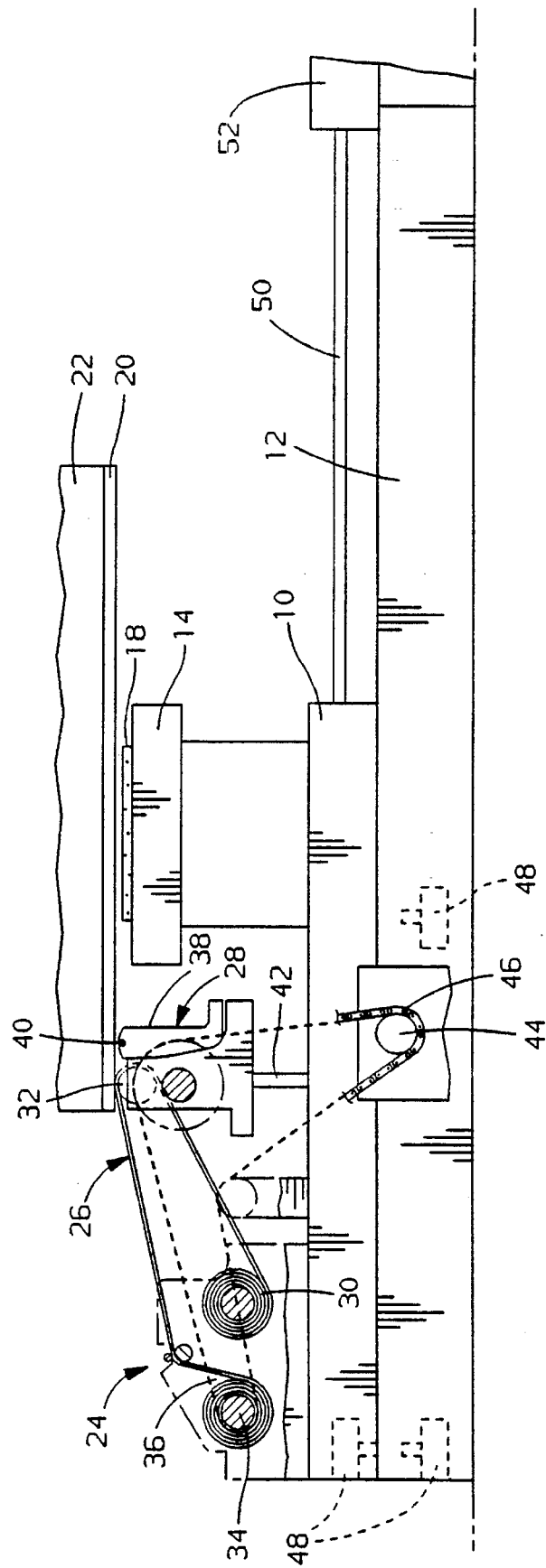
FIG. 3 illustrates a stencil cleaning apparatus according to the present invention including a dual action wiper and vacuum sub-assembly in a position engaging a stencil at an end after cleaning the stencil.

One embodiment of an apparatus according to the present invention is shown in FIG. 1. The apparatus includes a slide 10 which rides on a pair of parallel rails 12. The slide is selectively moved along the rails in a horizontal direction via a selectively operated pneumatic cylinder (not shown). Carried on the slide is a printing nest 14 for holding a substrate 18 on which solder bumps or conductive ink is to be printed. The substrate may be a ceramic substrate or a fiberglass circuit board. Once a substrate is placed on the printing nest, the slide is moved into a position underneath a stencil 20. The stencil is carried by a metallic frame which grasps the upper and bottom faces of the stencil along its outer edge. When the printing nest is positioned under the stencil there is a very limited clearance. The substrate is only $40/1000$th of an inch away from the stencil. A printing device (shown schematically at 22) then engages the top surface of the stencil and solder paste is deposited on the stencil. A squeegee of the printing device is moved from one end of the stencil to the other end to force the solder paste through holes selectively formed in the stencil. As the squeegee is moved across the stencil, sufficient force is exerted on the stencil so that it comes in contact with the substrate as the solder paste is pushed through holes of the stencil by the squeegee.

A stencil cleaning assembly 24 is also carried in the slide. The stencil cleaning assembly includes a wiper 26 for wiping the bottom face of the stencil and a vacuum source 28 for sucking solder paste through the holes of the stencil. The wiper may take on a variety of forms, but preferably includes a lint free felt-like paper. Preferably the paper is provided on a source or supply roll 30 which is carried by the slide. The paper is removed from the source roll and directed around a contact roller 32 carried by a movable wiper/vacuum sub-assembly. The contact roller is positioned so that the paper will contact (at 50) the bottom of the stencil when the dual wiper/vacuum sub-assembly is moved to engage the bottom surface of the stencil. The paper is then fed to a take-up roller 34 also carried by the slide. The take-up roller is preferably positioned so that the solder paste removed from the bottom face of the stencil is trapped between successive rolls of paper on the take-up roller at 36.

A vacuum nozzle 38 is also carried by the movable wiper/vacuum sub-assembly. The vacuum nozzle includes a first end having a slit 40 formed therein for drawing solder paste through the slit. The other end of the vacuum nozzle is connected to a vacuum pump or pumps carried inside the vacuum source 28. The wiper/vacuum sub-assembly is carried on a rod 42 of a pneumatic air cylinder. The pneumatic air cylinder can be selectively actuated to move the wiper/vacuum sub-assembly from a first position away from the bottom face of the stencil (shown in FIG. 1) to a second position (shown in FIG. 2) in which the wiper paper and the vacuum nozzle engage the bottom face of the stencil. The vacuum pump is then energized to draw vacuum through the nozzle slit and the slide is moved in a horizontal direction so that the wiper/vacuum sub-assembly moves from one end of the stencil to the other. As the wiper/vacuum subassembly is moved from one end of the stencil (shown in FIG. 2) to the other (shown in FIG. 3) by rod 50 of pneumatic cylinder 52, a drive 44 connected to the take-up roller is actuated so that the paper is advanced. Thus, clean wiper paper is continually supplied for wiping the bottom of the stencil as the wiper/vacuum sub-assembly is moved from one end of the stencil to the other. Preferably the drive is a motor having a sprocket attached thereto for advancing a continuous chain 46 connected to at least a contact roller and the take-up roller.

Proximity switches 48 may be appropriately positioned along the apparatus to selectively activate the pneumatic cylinder 52 for moving the slide 10, the pneumatic cylinder for raising and lowering the wiper/vacuum sub-assembly, and the motor for advancing the wiper paper.

Of course, the stencil cleaner apparatus may be utilized before or after every printing of a substrate or may be selectively utilized as needed to insure accurate printing of solder bumps or conductive ink. Appropriate control systems including a computer and software may be connected to the cleaning apparatus to accomplish this result.

The embodiments of the invention in which an exclusive property or privilege is claimed as defined as follows:

1. A stencil cleaner apparatus comprising:
    a wiper/vacuum assembly carried on a base, the wiper/vacuum assembly including a wiper and a vacuum having a vacuum nozzle;
    a first drive connected to the base for selectively moving the base from one end of a stencil to the other end of the stencil; and
    a second drive connected to the wiper/vacuum assembly for moving the wiper and the vacuum nozzle from a first position away from a bottom face of the stencil to a second position engaging the bottom face of the stencil so that solder paste lodged in holes formed in the stencil may be drawn through the vacuum nozzle upon operation of the wiper and the vacuum.

2. An apparatus as set forth in claim 1 further comprising a printing nest, carried by the base, for holding a substrate to be printed on.

3. An apparatus as set forth in claim 1 wherein said wiper comprises paper.

4. A stencil cleaner apparatus comprising:
    a wiper/vacuum assembly carried on a base, the wiper/vacuum assembly including a wiper assembly and a vacuum having a vacuum nozzle;
    a first drive connected to the base for selectively moving the base from one end of a stencil to the other end of the stencil;
    said wiper assembly comprising paper provided on a source roller and threaded over a contact roller to a take-up roller, and a selectively controllable drive connected to at least one of said rollers for selectively advancing said paper to continually provide clean paper over said contact roller as the base is moved from one end of the stencil to the other; and
    a second drive for moving said contact roller and said vacuum nozzle from a first position, wherein the paper over the contact roller and the nozzle are away from a bottom face of the stencil to a second position, wherein the paper over the contact roller and the nozzle engages the bottom face of the stencil so that the paper wipes the bottom face of the stencil and the vacuum nozzle sucks solder or ink from holes formed in the stencil as the base is moved from one end of the stencil to the other end of the stencil.

* * * * *